United States Patent
Adams et al.

(10) Patent No.: US 9,819,113 B2
(45) Date of Patent: Nov. 14, 2017

(54) ELECTRICAL CONNECTION APPARATUS

(71) Applicant: Megger Instruments Ltd, Dover (GB)

(72) Inventors: Eddie Adams, Dover (GB); Andrew Gilham, Dover (GB)

(73) Assignee: MEGGER INSTRUMENTS LTD, Dover (GB)

( * ) Notice: Subject to any disclaimer, the term of this patent is extended or adjusted under 35 U.S.C. 154(b) by 0 days.

(21) Appl. No.: 15/232,098

(22) Filed: Aug. 9, 2016

(65) Prior Publication Data
US 2016/0352037 A1 Dec. 1, 2016

Related U.S. Application Data

(63) Continuation of application No. PCT/GB2015/050360, filed on Feb. 10, 2015.

(30) Foreign Application Priority Data

Feb. 11, 2014 (GB) .................................. 1402360.0

(51) Int. Cl.
*H01R 4/48* (2006.01)
*H01R 13/453* (2006.01)
*H01R 11/24* (2006.01)
*G01R 1/067* (2006.01)
*H01R 13/02* (2006.01)

(52) U.S. Cl.
CPC ..... *H01R 13/4532* (2013.01); *G01R 1/06788* (2013.01); *H01R 4/48* (2013.01); *H01R 11/24* (2013.01); *H01R 13/025* (2013.01)

(58) Field of Classification Search
CPC ...... G01R 1/06788; H01R 11/24; H01R 4/48; H01R 13/4532
See application file for complete search history.

(56) References Cited

U.S. PATENT DOCUMENTS

| 3,594,692 | A | * | 7/1971 | Oakes | H01R 31/06 |
| | | | | | 439/268 |
| 4,565,414 | A | * | 1/1986 | French | H01R 11/24 |
| | | | | | 439/241 |
| 4,913,668 | A | | 4/1990 | Chamberlain | |
| 4,923,415 | A | * | 5/1990 | Lee | H01R 11/24 |
| | | | | | 439/504 |

(Continued)

FOREIGN PATENT DOCUMENTS

EP 2442115 A1 4/2012

OTHER PUBLICATIONS

International Search Report and Written Opinion issued in related PCT Application No. PCT/GB2015/050360, dated May 15, 2015.

*Primary Examiner* — Briggitte R Hammond
(74) *Attorney, Agent, or Firm* — EIP US LLP

(57) ABSTRACT

A clamp for establishing an electrical connection with a conductor is provided. The clamp comprises a first body and a second body. The second body is pivotally coupled to the first body. The first and second bodies define a receiving region therebetween for receiving a conductor. The first and second bodies are biased towards each other at the receiving region to clamp a conductor. The clamp also comprises a shutter, movably coupled to one of the first body and the second body. The shutter is biased into a restricting position in which entry into the receiving region is restricted.

19 Claims, 12 Drawing Sheets

(56) References Cited

U.S. PATENT DOCUMENTS

| | | | | |
|---|---|---|---|---|
| 5,456,144 | A * | 10/1995 | Dahl | B25B 7/02 |
| | | | | 269/6 |
| 5,772,468 | A * | 6/1998 | Kowalski | H01R 11/24 |
| | | | | 439/506 |
| 6,336,386 | B1 * | 1/2002 | Lee | B25B 7/18 |
| | | | | 269/6 |
| 7,422,474 | B1 * | 9/2008 | Good | H01R 11/24 |
| | | | | 439/504 |
| 9,461,376 | B1 * | 10/2016 | Bakhoum | H01R 11/286 |
| 2004/0172795 | A1 | 9/2004 | Cheng et al. | |
| 2004/0229499 | A1 * | 11/2004 | Cottle | H01R 11/24 |
| | | | | 439/504 |
| 2010/0304621 | A1 * | 12/2010 | Schouten | H01R 11/24 |
| | | | | 439/772 |
| 2011/0287673 | A1 * | 11/2011 | Fan | H01R 13/025 |
| | | | | 439/828 |

* cited by examiner

ELECTRICAL CONNECTION APPARATUS

CROSS-REFERENCE TO RELATED APPLICATIONS

This application is a continuation under 35 U.S.C. §120 of International Application No. PCT/GB2015/050360, filed Feb. 10, 2015 (published by the International Bureau as International Publication No. WO2015/121631 on Aug. 20, 2015), which claims priority to UK Patent Application No. GB 1402360.0, filed Feb. 11, 2014. The entire contents of each of the above-referenced applications are hereby incorporated by reference.

BACKGROUND OF THE INVENTION

Field of the Invention

The present invention relates to establishing electrical connections. In particular, the present invention relates to electrical connection apparatus for high energy or high voltage applications.

Description of the Related Technology

Electrical test equipment apparatus are typically attached temporarily to electrical circuits in order to provide measurements or other information about the operation of the circuit. Such test equipment commonly measures either an electromagnetic field emanating from the electrical circuit, or requires electrical contact with an electrically conductive part of the circuit. Such electrical contact is typically established via an electrical connection apparatus, such as a clamp. Various clamps, including probes and clips, are known in the art which fulfill the purpose of an electrical connection apparatus.

It is desirable to insulate a user from electrically conductive parts of a test equipment as well as the electrical circuit under test, not only for the user's safety but also to improve the accuracy of the test equipment. A conventional known electrical connection apparatus may comprise an electrically conductive portion for making a connection with the circuit under test, and an electrically insulating handle portion, which allows the user to grip the connection apparatus without touching the electrically conductive part. However, such an approach is not sufficient for high energy or high voltage applications, where further steps should be taken to prevent even accidental contact between the user and electrically conductive portions of the connection apparatus. Such electrical connection apparatus have applications outside the field of electrical test equipment, and apply to connectors for electrical circuits in general.

Hence, it is an object of the present invention to provide measures for establishing an electrical connection that provide increased protection for users from electrically conducting parts.

SUMMARY

According to a first aspect of the present invention, there is provided a clamp for establishing an electrical connection with a conductor, the clamp comprising:
  a first body;
  a second body, pivotally coupled to the first body, the first and second bodies defining a receiving region therebetween for receiving a conductor, the first and second bodies being biased towards each other at the receiving region to clamp a conductor; and
  a shutter, movably coupled to one of the first body and the second body, the shutter being biased into a restricting position in which entry into the receiving region is restricted.

Further features and advantages of the invention will become apparent from the following description of preferred embodiments of the invention, given by way of example only, which is made with reference to the accompanying drawings.

DETAILED DESCRIPTION OF CERTAIN INVENTIVE EMBODIMENTS

A clamp apparatus, or 'clamp', for establishing an electrical connection is provided which utilizes a closure mechanism for preventing access to the inside of the clamp while the clamp is in a closed configuration. The closure is displaceable by an object, such as a conductor, introduced into the clamp while the clamp is in an open configuration, such that an electrical connection can be established with the object when the clamp is configured into an engaged configuration.

Figure 1:
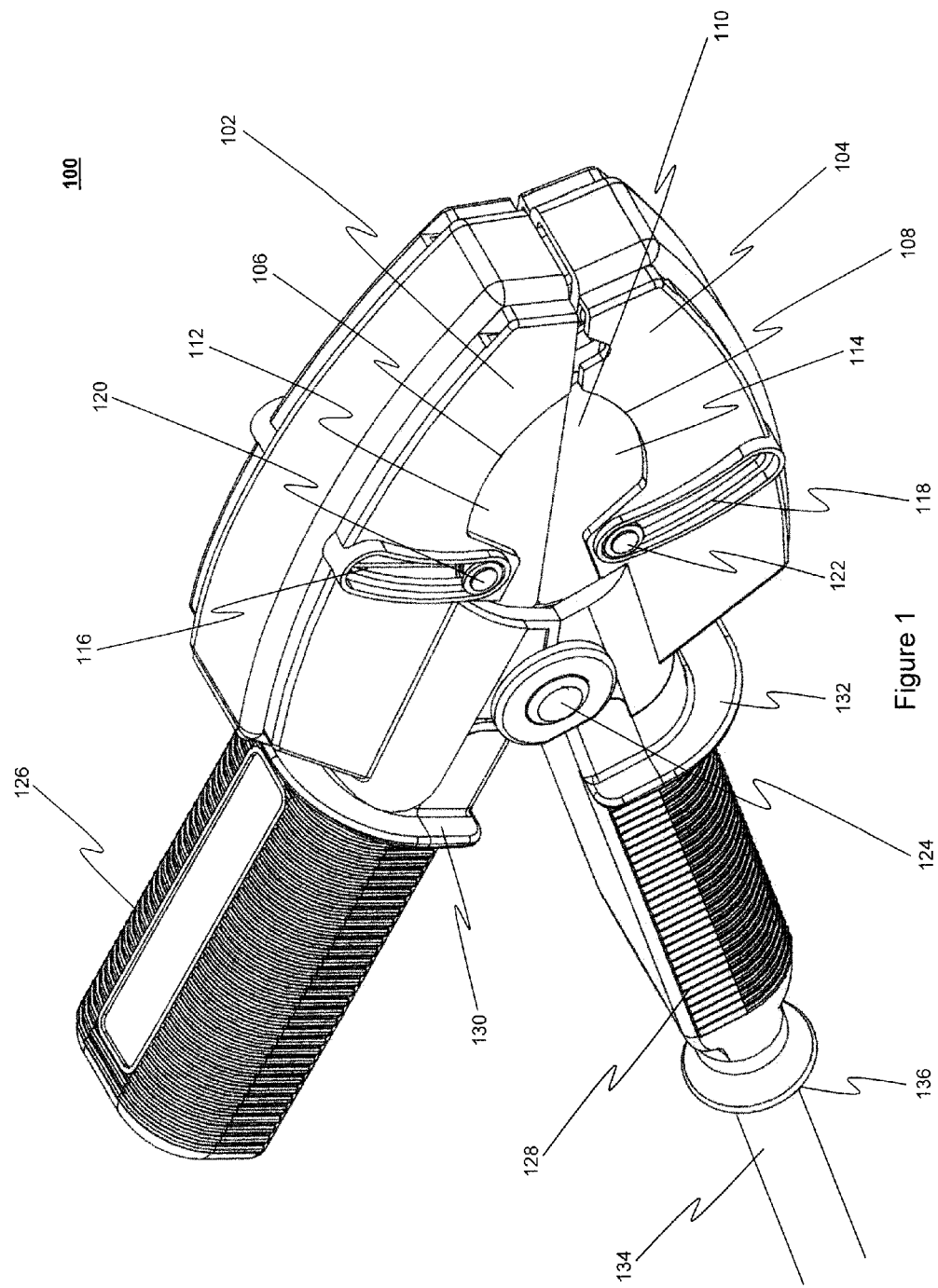
FIG. 1 is a perspective view of a clamp according to embodiments in a closed configuration.
Figure 2:
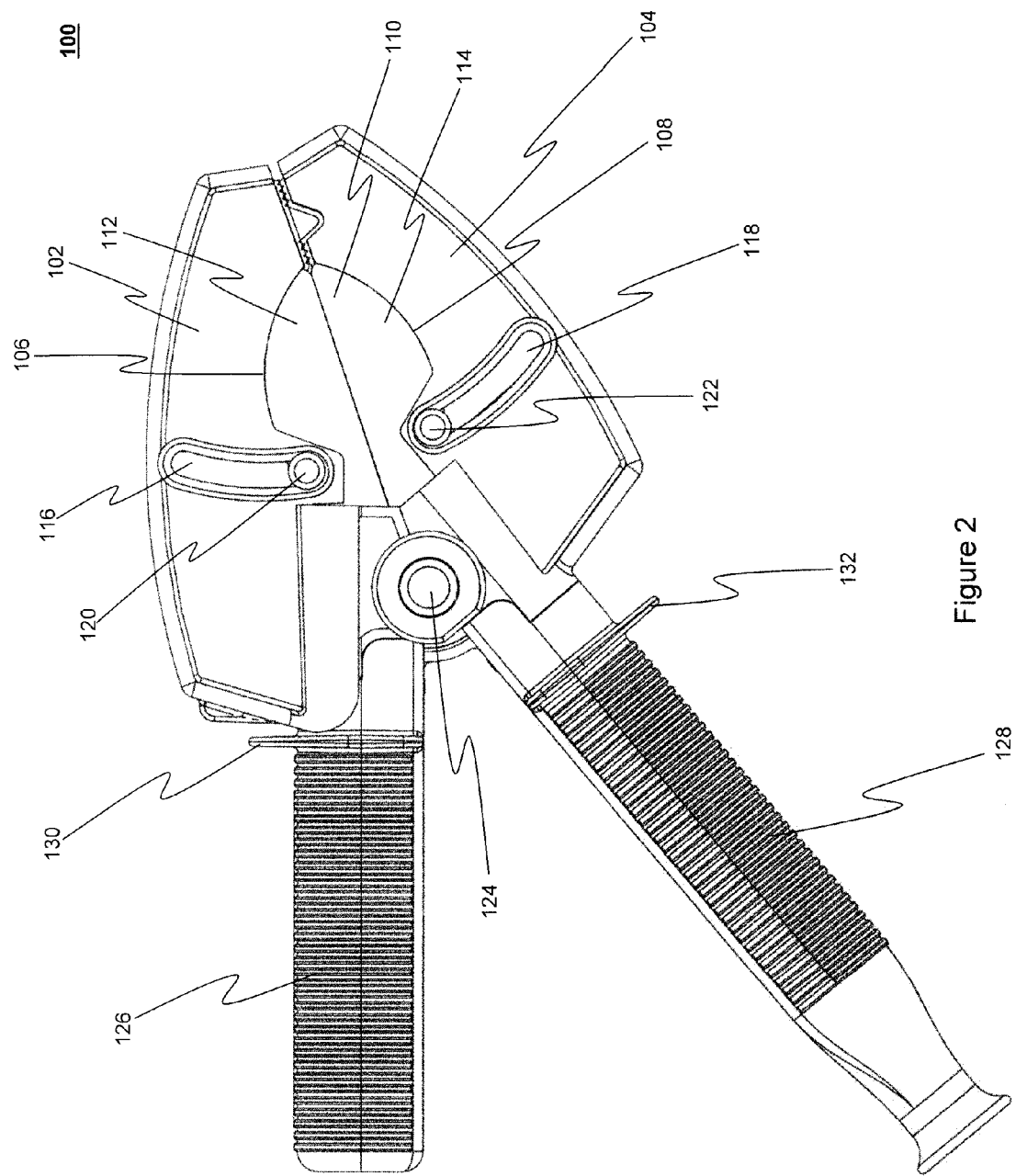
FIG. 2 is a side view of a clamp according to embodiments in a closed configuration.

FIGS. 1 and 2 illustrate a perspective view and a side view respectively of an example clamp in a closed configuration. Clamp 100 includes body 102 and body 104 which also serve as housings for internal components of clamp 100 and provide structural support to the same. Bodies 102 and 104 are arranged to define a receiving region inside the clamp 100 for the accommodation of conductors. Bodies 102 and 104 are configured with edge portions 106 and 108 respectively. The edge portions 106 and 108 define an opening between the outside of the clamp 100 and the receiving region inside. Bodies 102 and 104 are moveable in relation to each other in order to configure clamp 100 into one of a number of configurations. In FIGS. 1 and 2, clamp 100 is shown in a closed configuration in which bodies 102 and 104 are positioned relatively close, i.e. proximate, to each other at the receiving region.

Clamp 100 also includes closure 110, which restricts entry into the receiving region via the opening between edge portions 106 and 108 when body 102 and body 104 are positioned proximate to each other at the receiving region. More generally, clamp 100 may be referred to as being in the closed configuration when so configured. Hence, closure 110 prevents objects, such as a person's finger, from being accidentally inserted into the receiving region via the opening when clamp 100 is in the closed configuration, for example when clamp 100 is not in use.

Closure 110 is displaceable. In embodiments, the closure comprises one or more shutters. A shutter may comprise a closure portion with a substantially planar surface region, arranged to extend across at least a part of the opening. In the embodiments depicted in the figures, closure 110 includes shutter 112 which is coupled to body 102, and shutter 114 which is coupled to body 104. Shutters 112 and 114 are displaceable. In embodiments, shutters 112 and 114 are slidable. In the embodiments depicted in the figures, the movements of shutters 112 and 114 are guided by shutter guides 116 and 118 respectively. Shutter 112 is slidably coupled to shutter guide 116 by guide pin 120. Similarly, shutter 114 is slidably coupled to shutter guide 118 by guide pin 122. In alternative embodiments (not shown), the shutter guide may be provided in the form of a groove, in which an edge of a shutter may be situated. In this manner, the requirement for a guide pin to couple a shutter to the corresponding shutter guide may be avoided. Use of shutter guides 116, 118 serves to provide additional support to shutters 112, 114 (and therefore closure 100) against being deflected in a lateral direction, i.e. direction perpendicular to the plane of FIG. 2. This support helps to prevent objects from being accidentally inserted into the receiving region via the opening when clamp 100 is in the closed configuration. In yet further embodiments, the use of a shutter guide may be dispensed with entirely, although in such embodiments the coupling of the shutter to the respective body will preferably comprise an alternative means to provide sufficient support against movement or deflection in a lateral direction of the shutter over its range of motion.

While in the embodiments depicted in the figures closure 110 comprises two shutters 112, 114, in alternative embodiments (not shown) closure 110 may comprise a single shutter, coupled to body 102 or body 104, which substantially covers the opening between edge portions 106 and 108. As well as the opening between edge portions 106 and 108, a further opening may be provided on the opposite side of clamp 100 (i.e. the reverse side of clamp 100 when viewed from the side view shown in FIG. 2) between similar, corresponding edge portions on the opposite side of bodies 102 and 104. This further opening may be located on the opposite side of the receiving region to closure 110, and/or the opening between edge portions 106 and 108. Provision of such a further opening on the opposite side of the receiving region enables the accommodation of conductors, such as cables, that extend through both sides of clamp 100. In such embodiments, clamp 100 may additionally comprise a further closure (not shown), which is arranged substantially to cover the further opening. This further closure may be configured, similarly to closure 110, to restrict entry into the receiving region via the further opening when body 102 and body 104 are positioned proximate to each other at the receiving region (i.e. in the closed configuration).

Body 102 is rotatably coupled to body 104 via body coupling means 124. In the embodiments depicted in the figures, body coupling means 124 includes a hinge or pivot. In alternative arrangements, body coupling means 124 may comprise an alternative pivotal coupling mechanism, such as an integrally formed flexible joint. Clamp 100 may also include body biasing means, configured to bias body 102 and body 104 towards each other at the receiving region, and to cause clamp 100 to move by default into the closed configuration. This has the effect of ensuring that the opening between edge portions 106 and 108 remains substantially covered by closure 110 when clamp 100 is not in use. The body biasing means may comprise a resilient member, such as a torsion spring comprised within body coupling means 124, a tension spring located between body 102 and body 104 on the same side of body coupling means 124 as the receiving region, or a compression spring located on the opposite side of body coupling means 124 to the receiving region.

Clamp 100 may further comprise opening means, operable to move body 102 away from body 104 at the receiving region, and thereby configure clamp 100 into an open configuration. In the embodiments depicted in the figures, the opening means comprises gripping portions 126 and 128, in this case in the form of handles. Gripping portion 126 may be formed integrally as part of body 102, or otherwise coupled to body 102. Similarly, gripping portion 128 may be formed integrally as part of body 104, or otherwise coupled to body 104. One or both of the gripping portions 126, 128 may have a surface that is contoured to provide improved friction on the surface, such as through the provision of ridges or other surface features. Alternatively or additionally, at least a part of the surface of one or both of the gripping portions may include a material with a high coefficient of friction, such as a rubber or foam. Such surfaces may serve to prevent a user's hand from slipping along gripping portions 126 and 128 during use. Gripping portions 126 and 128 may further comprise guard portions 130 and 132 respectively, which serve to prevent a user's hand from slipping further along gripping portions 126 and 128 towards the receiving region during use. Clamp 100 may also comprise electrical conduction means, such as electrical cable 134, for passing electrical current between the host equipment to which the electrical conduction means is connected, and a target conductor (for example, forming part of a circuit under test) to which clamp 100 is to be connected. Electrical conduction means 134 may be accommodated into clamp 100 via through-hole 136. In embodiments, through-hole 136 may comprise a strain relief. In some embodiments, through-hole 136 is sized to accommodate cables 134 of varying cross-sections. In embodiments, through-hole 136 is located in an end region of gripping portion 128.

In the embodiments shown in the figures, shutters 112, 114 of closure 110 are displaceable within the plane of the figure. In some embodiments, shutters 112, 114 are displaceable in a plane parallel to the opening defined by edge portions 106, 108. In embodiments, shutters 112, 114 are slidable with respect to one or more of body 102 and body 104. Such a sliding arrangement ensures that pressure applied perpendicular to the plane of FIG. 2 does not cause the closure to deflect inwardly (i.e. into the opening) or open. The configuration of closure 110 will now be described further in relation to FIG. 3.

Figure 3:
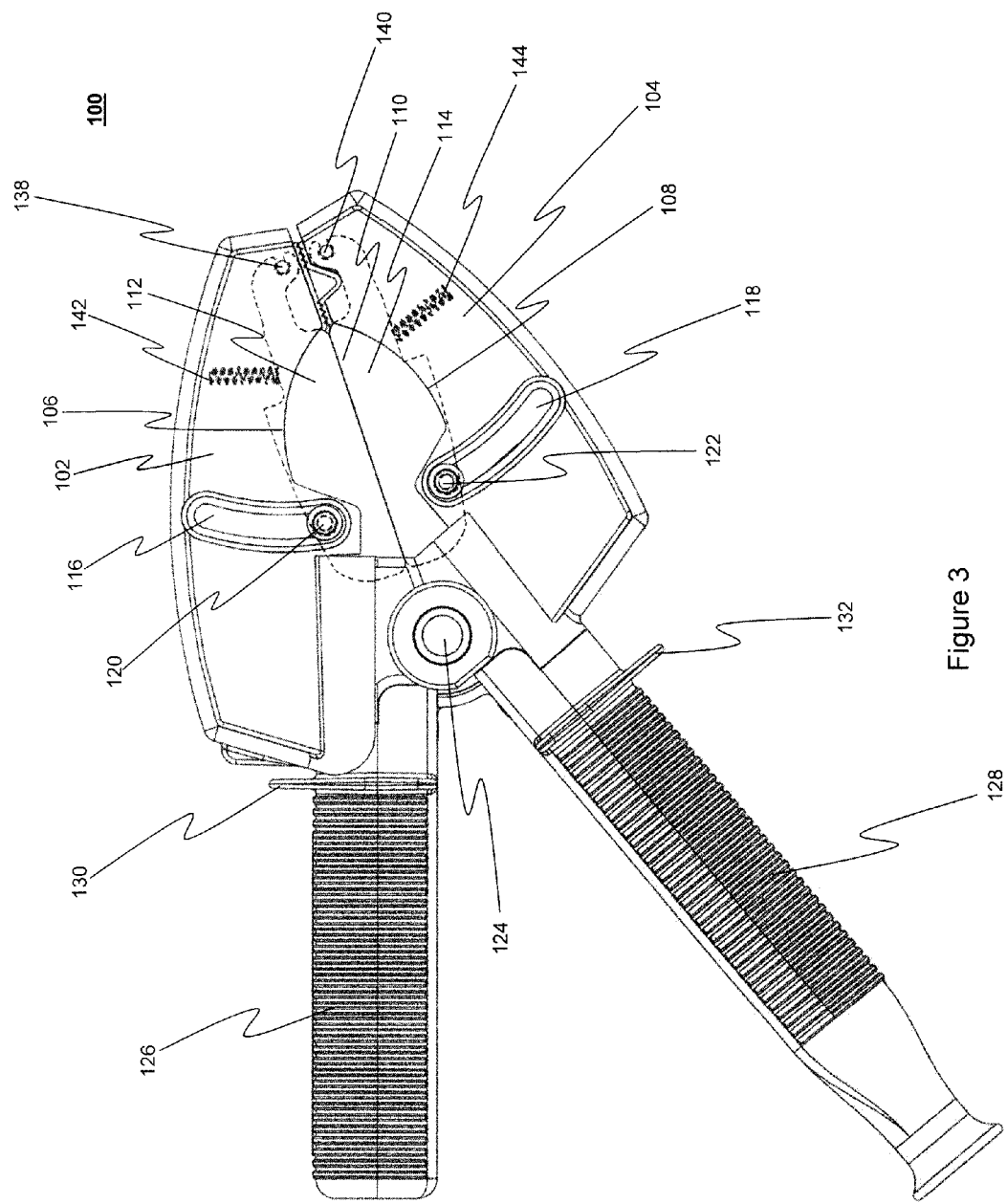
FIG. 3 is a side view of a clamp according to embodiments in a closed configuration, and showing the internal location of closure mechanism parts.

FIG. 3 illustrates a side view of clamp 100 in the closed configuration according to embodiments, in which internal parts of the mechanism of closure 110 are depicted by broken lines where they would otherwise be obscured from view by other components of clamp 100.

Shutter 112 is coupled to body 102 via shutter coupling means 138. Similarly, shutter 114 is coupled to body 104 via shutter coupling means 140. In the embodiments depicted in the figures, shutter coupling means 138 and 140 each comprise a pivot. In alternative embodiments, the shutter coupling means may comprise an alternative rotatable coupling mechanism (such as a hinge) or a sliding coupling mechanism (such as a shutter guide and optional guide pin). In embodiments, shutters 112, 114 are resistively biased into the illustrated restricting position using shutter biasing means 142, 144. In the embodiments depicted in the figures, shutter biasing means 142, 144 each comprise a resilient member such as a spring. In particular, in the embodiments depicted in the figures, shutter biasing means 142, 144 each comprise a compression spring. In alternative embodiments, shutter biasing means 142, 144 each comprise a tension spring. In further alternative embodiments, shutter biasing means 142, 144 each comprise a torsion spring. Use of shutter coupling means 138, 140 in combination with shutter biasing means 142, 144 causes shutters 112, 114 to move by default into the depicted restricting position. This has the effect of ensuring that the opening between edge portions 106 and 108 remains substantially covered when clamp 100 is not in use, i.e. when clamp 100 is in the closed configuration, with body 102 proximate to body 104 at the receiving region.

Figure 4:
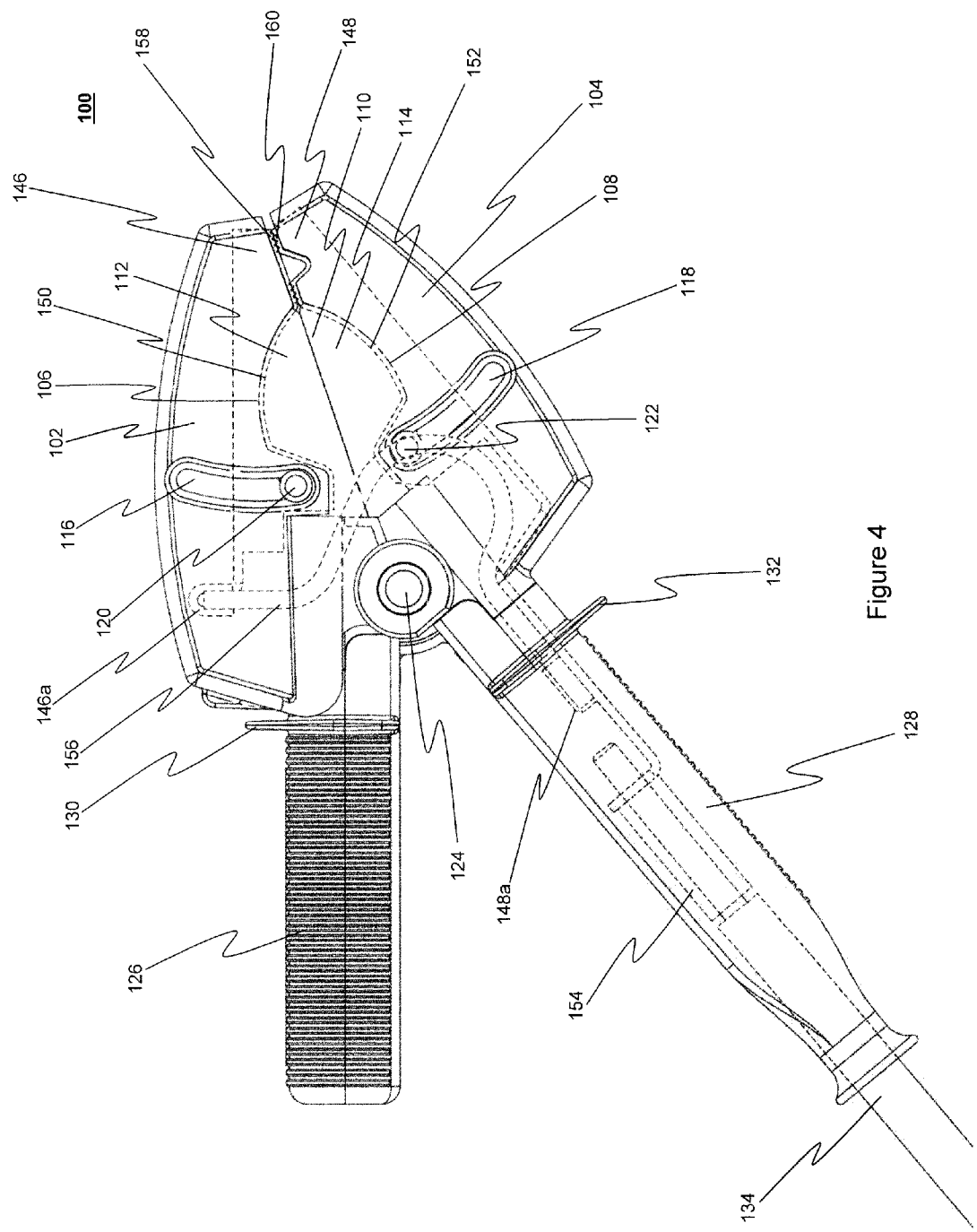
FIG. 4 is a side view of a clamp according to embodiments in a closed configuration, and showing the internal location of electrically conductive parts.

FIG. 4 illustrates a side view of clamp 100 in the closed configuration according to embodiments, with the internal electrically conductive parts depicted by broken lines where they would otherwise be obscured from view by other components of clamp 100. In FIG. 4, the surface contouring of gripping portion 128 has been omitted to provide clearer visibility of the internal electrically conductive parts.

Clamp 100 includes one or more electrical connection parts 146 and 148 for establishing an electrical connection with a target conductor. Electrical connection parts 146 and 148 each comprise an electrical connection surface 150, 152. In embodiments, the one or more electrical connection parts 146, 148 are positioned in the receiving region between body 102 and body 104. In embodiments, closure 110 is positioned between the one or more electrical connection parts 146, 148 and an opening defined between edge portions 106 and 108. In the embodiments depicted in the figures, electrical connection surfaces 150 and 152 generally follow the profile of edge portions 106 and 108 respectively. However, electrical connection surfaces 150 and 152 are arranged to extend further into the receiving region between body 102 and body 104 than edge portions 106 and 108 to allow an electrical connection to be established with conductors positioned in the receiving region. In alternative embodiments, the shape of electrical connection surfaces 150 and 152 need not generally follow the profile of edge portions 106 and 108.

The one or more electrical connection parts 146, 148 are conductively coupled to electrical conduction means 134. In embodiments, the one or more electrical connection parts 146, 148 are conductively coupled to electrical conduction means 134 by an electrical connection terminal 154. In embodiments where clamp 100 comprises an electrical connection part in each of body 102 and body 104, the two electrical connection parts may be conductively coupled by means of an electrical linkage 156. Electrical linkage 156 may connect to electrical connection part 146 via linkage connection portion 146a of electrical connection part 146, and to electrical connection part 148 via linkage connection portion 148a of electrical connection part 148. Electrical linkage 156 may be flexible to facilitate the relative movement of body 102 and body 104.

In some embodiments, a region may be provided where one or more of the electrical connection parts are not covered by the closure, such as in a jaw region of clamp 100, which may include jaw portion 158 of electrical connection part 146 and jaw portion 160 of electrical connection part 148. In such embodiments, clamp 100 may be arranged such that the separation between the body 102 and body 104 in this region is smaller than the diameter of a person's finger, to prevent access to electrical connection parts when clamp 100 is in the closed configuration. In such embodiments, this separation may be less than 5 mm. Hence a user is prevented from accidentally touching a conducting part of clamp 100 in this region when clamp 100 is in the closed configuration In the embodiments shown in the figures, clamp 100 includes two electrical connection parts 146, 148, and two corresponding electrical connection surfaces 150, 152, located in body 102 and body 104 respectively. In alternative embodiments clamp 100 may comprise a single electrical connection surface, located in either body 102 or body 104. In such embodiments, the resilient force applied by the other body towards the body which includes the electrical connection surface is sufficient to make an electrical connection with a target conductor.

By operating opening means 126, 128, body 102 may be separated from body 104 and thereby urge body 102 and body 104, and, more generally, clamp 100, into an open configuration.

Figure 5:
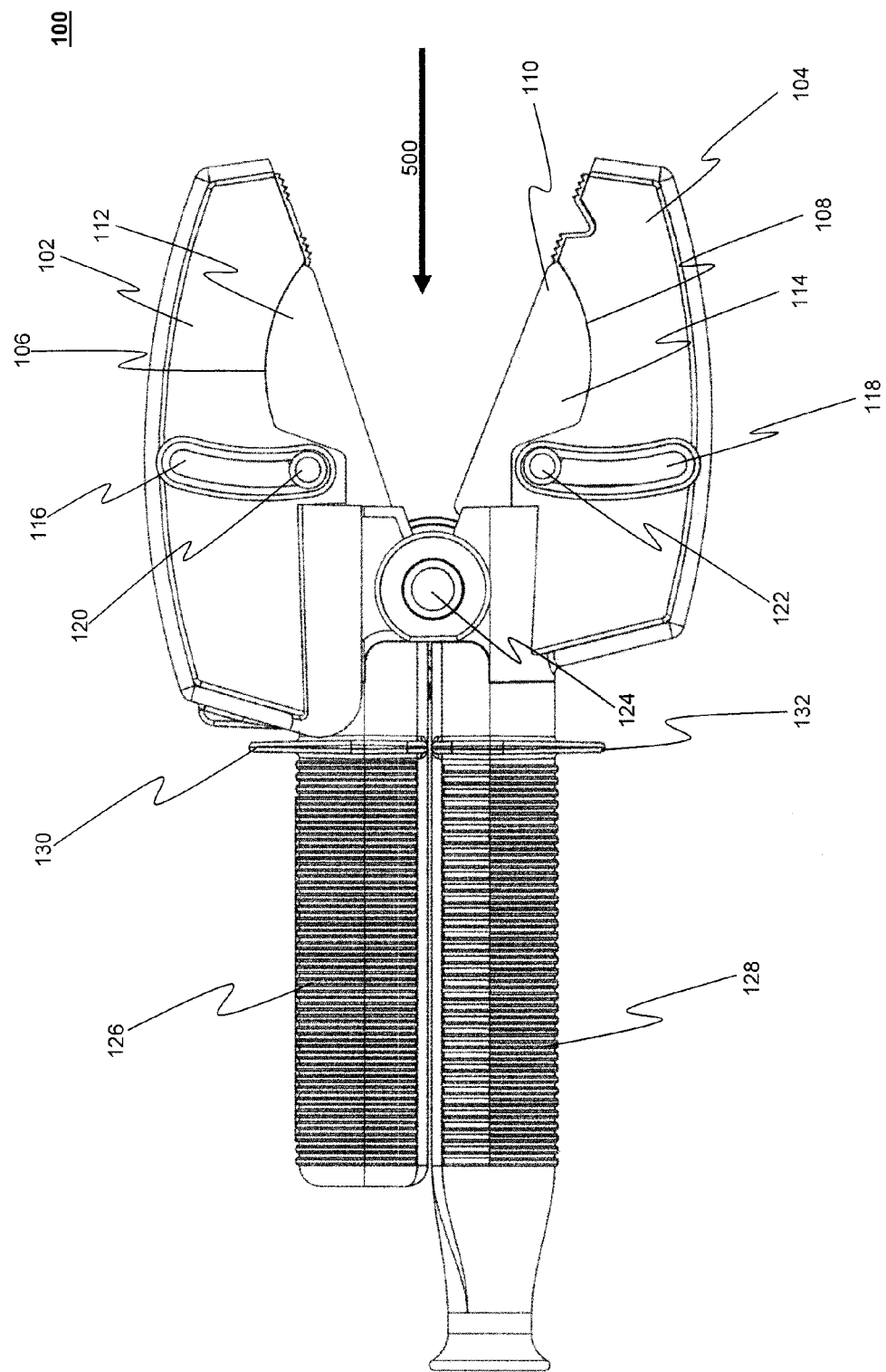
FIG. 5 is a side view of a clamp according to embodiments in an open configuration.

FIG. 5 illustrates a side view of clamp 100 in such an open configuration according to embodiments. In the embodiments depicted in the figures, clamp 100 is configured into an open configuration by operating gripping portions 126 and 128 in order to bring them relatively closer together. Configuring clamp 100 into the open configuration allows a conductor to be introduced into the receiving region between body 102 and body 104 by moving the conductor relative to clamp 100 in the direction of arrow 500. In the open configuration, with no conductor in the receiving region, shutters 112 and 114 remain in the restricting position, as can be seen in FIGS. 5 and 6.

Figure 6:
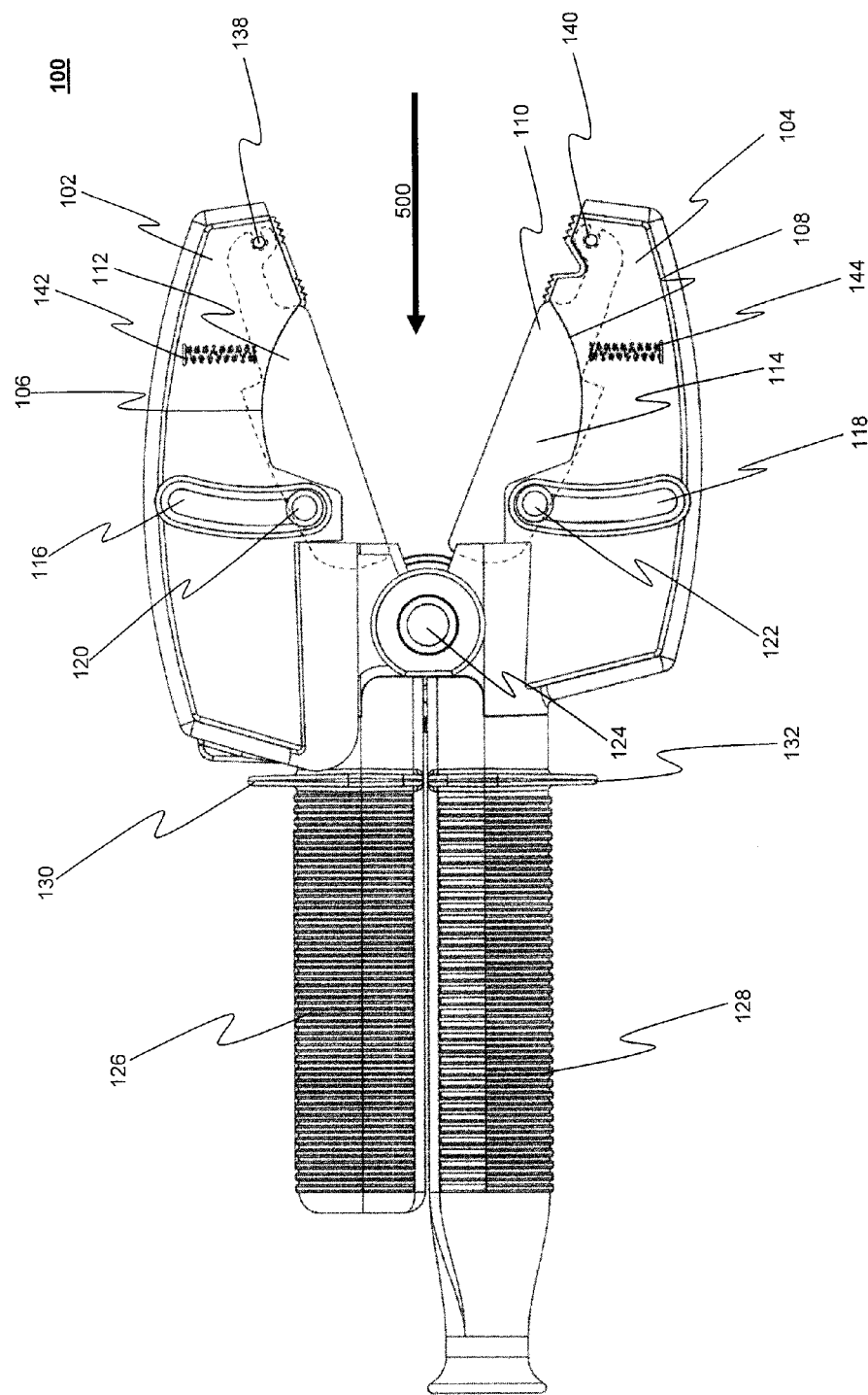
FIG. 6 is a side view of a clamp according to embodiments in an open configuration, and showing the internal location of closure mechanism parts.

FIG. 6 illustrates a side view of clamp 100 in the open configuration according to embodiments, with the internal parts of the mechanism of closure 110 depicted in broken lines where they would otherwise be obscured from view by other components of clamp 100.

Figure 7:
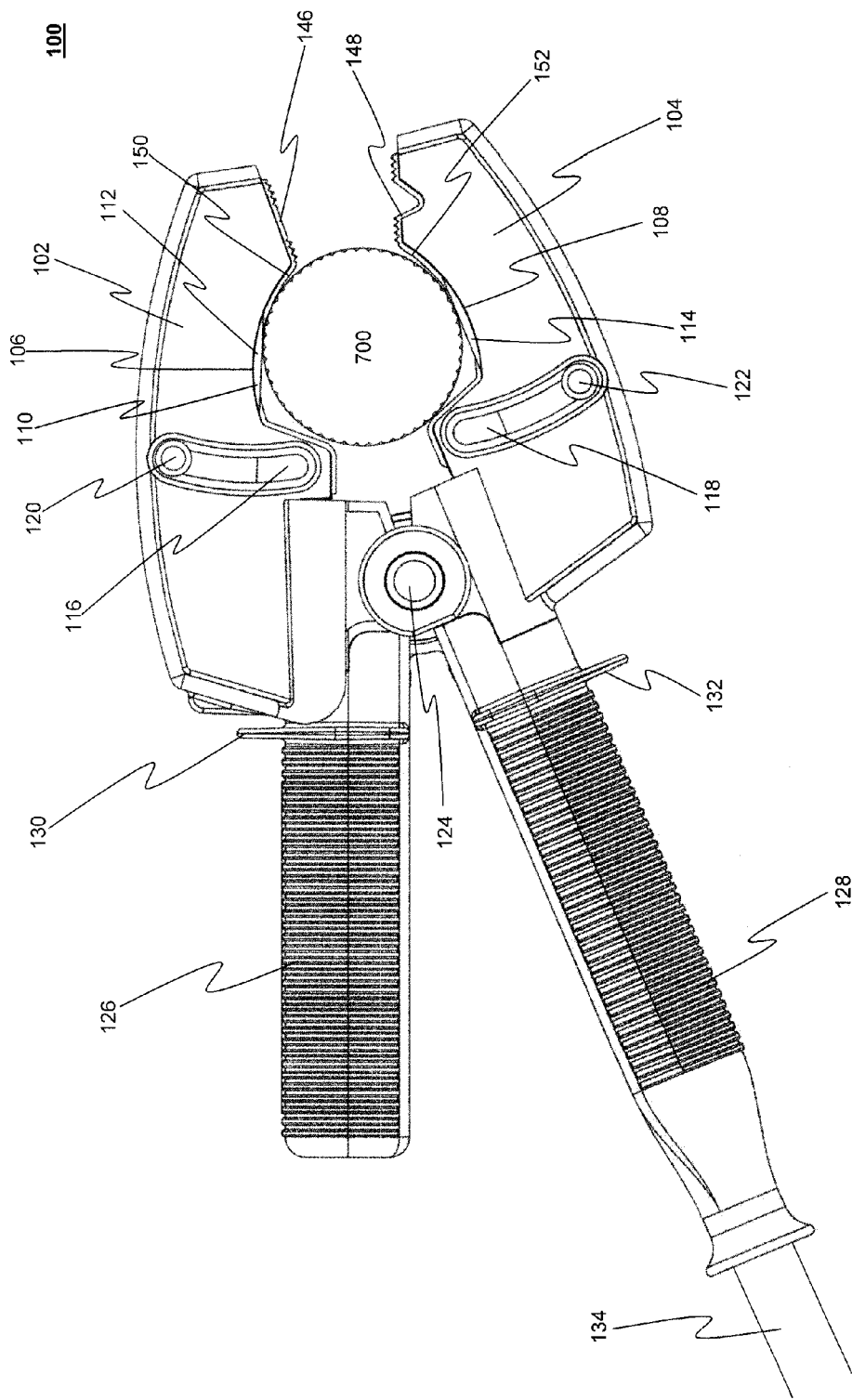
FIG. 7 is a side view of a clamp according to embodiments in an engaged configuration with a conductor.

FIG. 7 illustrates a side view of clamp 100 according to embodiments in an engaged configuration with conductor 700 having a circular cross section. In the embodiments depicted in the figures, conductor 700 is an electrical cable, for example of the variety used for electrical transmission lines. Conductor 700 may instead be an electrical terminal post for example, or other elongate conductor. It will be appreciated that clamp 100 is not limited to engaging with conductors having a circular cross section. For example, other cross sections to which clamp may engage may be non-circular, for example square or hexagonal, oval or rectangular, or comprise other regular or irregular forms, provided that at least a portion of the conductor may be accommodated in the receiving region of clamp 100.

Having moved conductor 700 into the receiving region between body 102 and body 104 when clamp 100 was in the open configuration, clamp 100 has now been moved from the open configuration into the engaged configuration by further operating opening means 126, 128 to cause body 102 and body 104 to close around conductor 700. In this manner, clamp 100 is configured to clamp conductor 700 by engaging opposing sides of conductor 700. In the embodiments depicted in the figures, gripping portions 126 and 128 are released such that the resilient biasing of body 102 and body 104 causes the bodies 102, 104 to close around conductor 700 into the engaged configuration.

Figure 8:
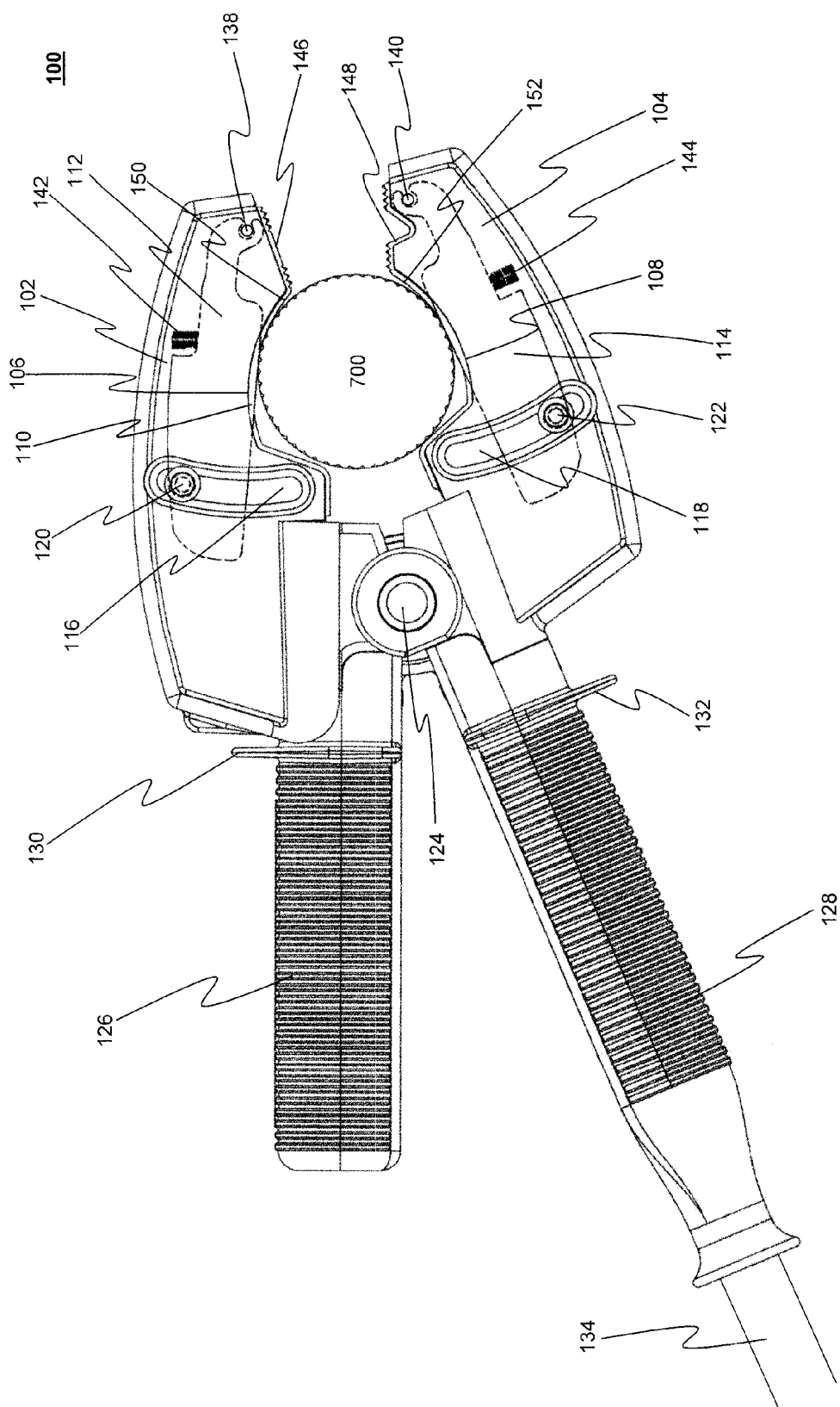
FIG. 8 is a side view of a clamp according to embodiments in an engaged configuration with a conductor, and showing the internal location of closure mechanism parts.

In the transition of clamp 100 from the open configuration to the engaged configuration, shutters 112 and 114 are displaced from the restricting position into an accommodating position, by conductor 700, as shown in FIGS. 7 and 8. In the embodiments depicted in the figures, closure 110 comprises shutters 112 and 114, which, when displaced, are retracted into body 102 and body 104 respectively upon transition of clamp 100 into the engaged configuration. Shutter 112 slides upwardly, into body 102, following the path defined by shutter guide 116. Similarly shutter 114 slides downwardly, into body 104 following the path defined by shutter guide 118. In some embodiments, one or more of the shutters 112, 114 are displaceable beyond the edge portion 106, 108 of the corresponding body portion 102, 104 to which the shutter is coupled, as depicted in FIG. 7.

In the engaged configuration, conductor 700 is brought into contact with the one or more electrical connection surfaces 150, 152, of electrical connection parts 146, 148. Hence, an electrical connection is established between the conductor 700 and clamp 100, and therefore between the conductor 700 and electrical conduction means 134.

In embodiments where a further opening is not provided on the opposite side of the receiving region to the opening defined between edge portions 106 and 108, an end region of conductor 700 may be accommodated in the receiving region such that conductor 700 passes through the opening defined between edge portions 106 and 108, and into the receiving region, but does not extend through the opposite side of clamp 100. In contrast, in embodiments where a further opening is provided on the opposite side of the receiving region to the opening defined between edge portions 106 and 108, any region along the length of conductor 700 may be accommodated in the receiving region, with conductor 700 extending through the openings on both sides of the receiving region.

In some embodiments, clamp 100 is configured, through the shape, size and relative positioning of body 102 and body 104, such that the size of the opening defined between edge portions 106 and 108 has a diameter of substantially 30 mm whilst the clamp 100 is in the closed configuration. In alternative embodiments, clamp 100 may be provided with a smaller or larger opening between edge portions 106 and 108, for example having a diameter in the range of 15 mm to 65 mm whilst clamp 100 is in the closed configuration. The size of the opening between edge portions 106 and 108 is extended when clamp 100 is configured into the open configuration to allow larger conductors to be accommodated in the receiving region. For example, in some embodiments, configuring clamp 100 into the open configuration may extend the opening between edge portions 106 and 108 to have a diameter of substantially 50 mm. In alternative embodiments, clamp 100 may be provided with a smaller or larger opening between edge portions 106 and 108 when in the open configuration, for example having a diameter in the range of 30 mm to 80 mm. In some embodiments, the separation of the edge portions 106 and 108 when in the open configuration may be increased yet further, to provide an opening having a diameter in the range of 80 mm to 160 mm, for example. Hence, in some arrangements, conductors 700 of between 30 mm and 50 mm in diameter may be accommodated in the receiving region. In further embodiments, conductors 700 of between 15 mm and 80 mm in diameter may be accommodated in the receiving region. In yet further example embodiments, conductors of up to 160 mm may be accommodated in the receiving region.

FIG. 8 illustrates a side view of clamp 100 according to embodiments in an engaged configuration with conductor 700 in which the internal parts of the mechanism of closure 110 are depicted by broken lines where they would otherwise be obstructed by other components of clamp 100. As can be seen in FIG. 8, in transition of clamp 100 from the open configuration to the engaged configuration, shutters 112 and 114 have slid into body 102 and body 104 respectively, and configured closure 110 from the restricting position into the accommodating position. This displacement of the shutters acts against the resilience of shutter biasing means 142, 144, such that when the conductor 700 is removed from the receiving region, shutters 112 and 114, and therefore the closure 110, will return to the restricting position.

In the embodiments depicted in the figures, shutter biasing means 142, 144 each comprise a compression spring. Hence, when closure 110 is in the accommodating configuration, the compression springs are compressed relative to their state in the restricting position. In alternative embodiments (not shown), shutter biasing means 142, 144 may each comprise a tension spring. In such embodiments, when the closure is in the accommodating configuration, the tension springs are extended relative to their state in the restricting position. Such tension springs may be positioned between the shutter 112, 114 and the edge portion 106, 108 of the respective body 102, 104.

It can be seen from the size and relative positions of electrical connection surfaces 150 and 152, that there is an effective minimum diameter size for conductors that can effectively be engaged within the receiving region. Therefore, in some embodiments, alternative means is provided for engaging smaller conductors.

Figure 9:
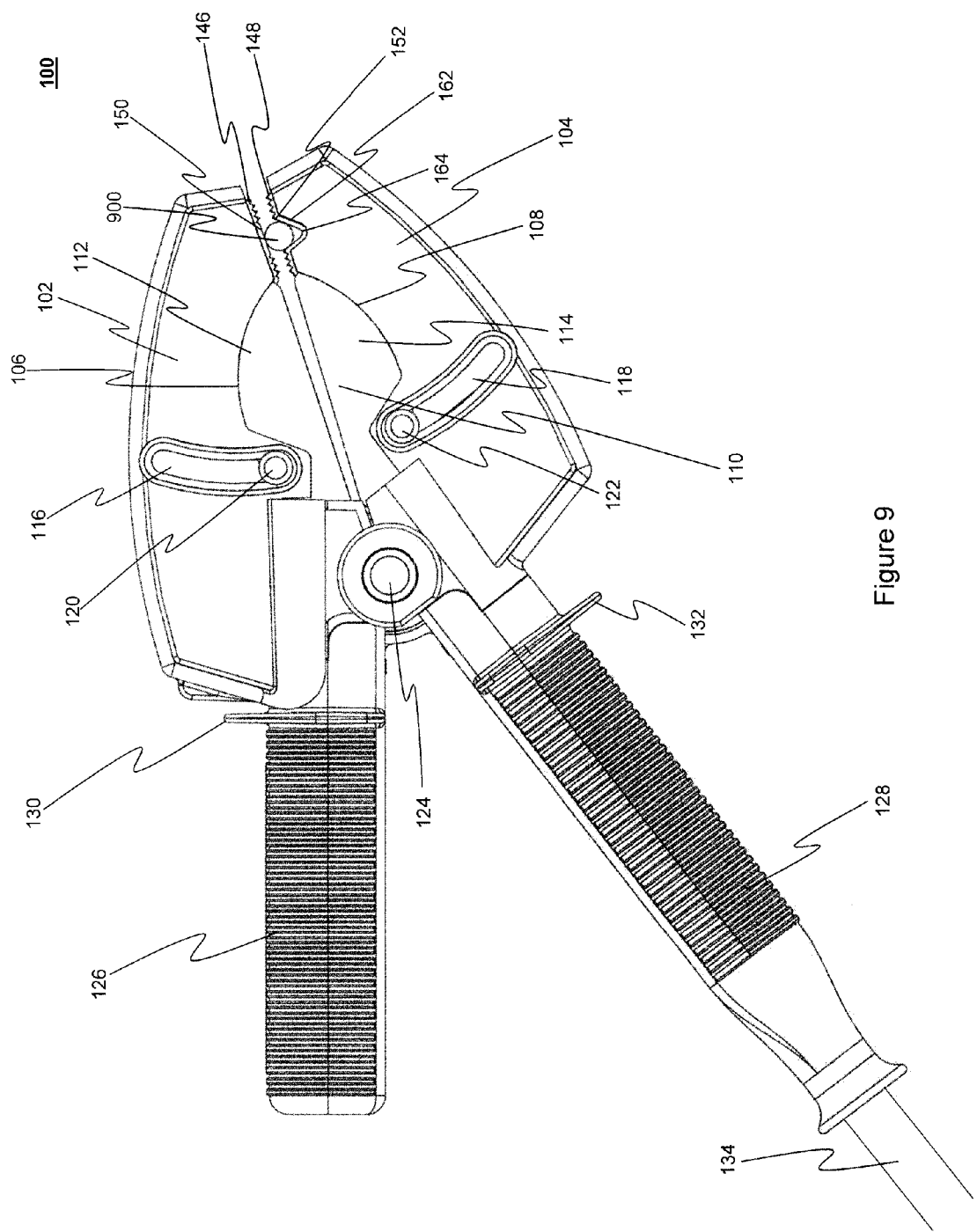
FIG. 9 is a side view of a clamp according to embodiments, connecting with a conductor via a notch portion.

FIG. 9 illustrates a side view of clamp 100 connecting with a conductor 900 via a notch according to embodiments. In some embodiments, body 102 and/or body 104 may comprise a notch portion 162, and electrical connection part 146 and/or electrical connection part 148 may comprise a notch portion 164, for accommodating a conductor 900 smaller than the minimum conductor size supported in the receiving region. Notch portions 162 and 164 may also be referred to as groove portions, or cutaway portions. In some embodiments, clamp 100 is configured, through the size of notch 164 and the relative positioning of body 102 and body 104, such that notch 162 can accommodate conductors 900 of between 5 mm and 25 mm in diameter. In this manner, notch 162 may be considered to define a notch region, having a volume smaller than the volume of the receiving region.

In embodiments, the width of notch 162 is configured such that access via notch 162 is restricted for objects of the size of a person's finger or more to prevent accidental touching of electrically conductive parts of clamp 100 when clamp 100 is in the closed configuration. In such embodiments, the maximum diameter object that can penetrate the notch 162 may be less than 5 mm. In other words, the notch is configured to prevent admission of a conductor having a diameter greater than 5 mm when clamp 100 is in the closed configuration. In such embodiments, notch 164 need not be restricted by closure 110, as protection of the user from electrically conductive parts of clamp 100 has already been achieved.

In some embodiments, further means may be provided for enabling connection with yet smaller diameter conductors, or conductors of a shape that cannot be readily accommodated in the receiving region (or in notch 162).

Figure 10:
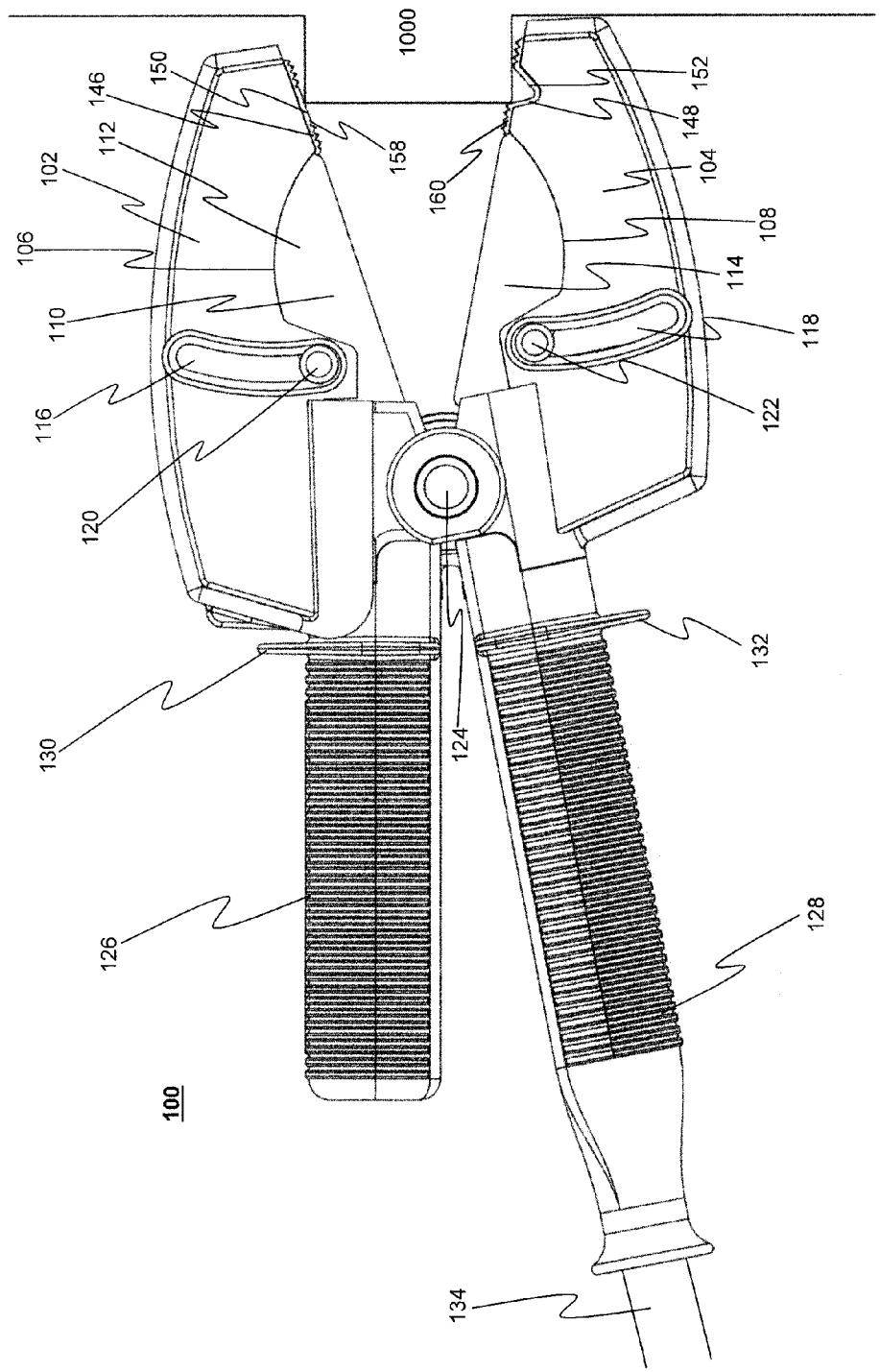
FIG. 10 is a side view of a clamp according to embodiments, connecting with a conductor via a jaw region.

FIG. 10 illustrates a side view of clamp 100 connecting with a conductor 1000 via a jaw portion according to embodiments. In the embodiments depicted in FIG. 10, electrical connection parts 146 and 148 each comprise jaw portions 158 and 160 respectively, in which the electrical connection surfaces 150 and 152 of electrical connection parts 146 and 148 are brought into contact when clamp 100 is in the closed configuration. In embodiments, the jaw portions 158 and 160 are located in an end region of electrical connection parts 146 and 148, of bodies 102 and 104, and of clamp 100 generally. The use of jaw portions 158 and 160 enable an electrical connection to be established with a conductor of arbitrary shape and size, such as conductor 1000. In embodiments, the electrical connection surfaces 150 and 152 of electrical connection parts 146 and 148 are contoured along the jaw portions 158 and 160 to provide interlocking surfaces. In some arrangements, these interlocking surfaces comprise serrations, or teeth.

Figure 11:
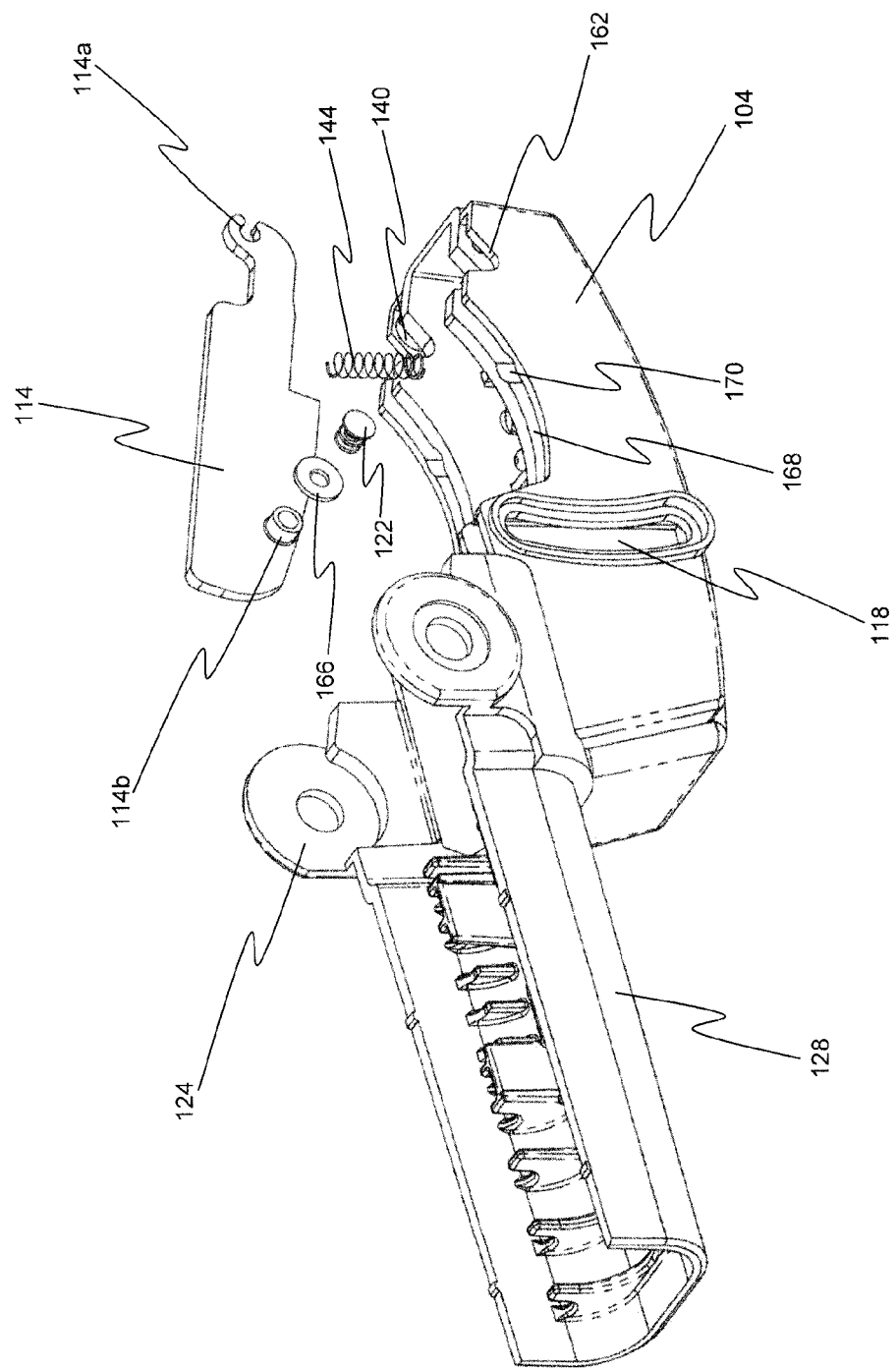
FIG. 11 is a perspective view of a portion of a clamp according to embodiments, showing an exploded view of closure mechanism parts.

FIG. 11 illustrates a perspective view of body 104 of clamp 100 according to embodiments, showing an exploded view of closure mechanism parts. Body 102 may be similarly configured. In the embodiments shown in FIG. 11, body 104 is integrally formed with gripping portion 128. In FIG. 11, gripping portion 128 is illustrated without the surface contouring depicted in previous figures. Shutter 114 comprises a first coupling portion 114a for coupling with shutter coupling means 140 (in this case a pivot), and a second coupling portion 114b for coupling with guide pin 122. Guide pin 122 is connectable with shutter 114 via shutter guide 118. In some embodiments, guide pin washer 166 is provided, connectable between coupling portion 114b of shutter 114 and guide pin 122, to improve the motion of guide pin 122 along the length of shutter guide 118 during operation of clamp 100. A shutter channel 168 is provided in body 104 to accommodate installation of shutter 114 into body 104. In the embodiments shown in FIG. 11, shutter biasing means 144 comprises a spring. Spring channel 170 is provided to accommodate installation of shutter biasing means 144 into body 104.

In embodiments, one or more parts of the closure mechanism are removable to accommodate replacement of such parts in case of damage. These replaceable parts may include one or more of the shutters 112, 114, the guide pins 120, 122, the shutter biasing means 142, 144, and the guide pin washers 166. In embodiments, the use of a tool is required to remove one or more of the removable parts, in order to reduce the ease with which the removable parts can be removed, and thereby reduce the associated risk of contact with electrically conductive parts of clamp 100 due to such removal.

Figure 12:
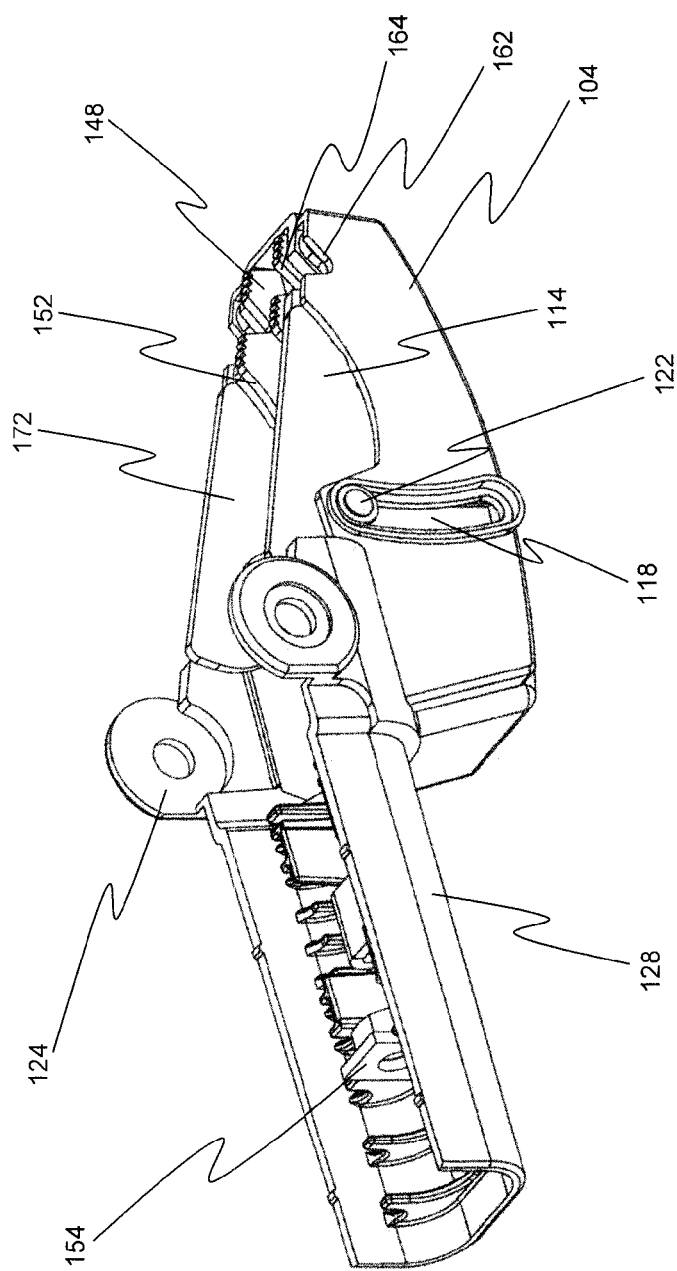
FIG. 12 is a perspective view of a portion of a clamp according to embodiments, showing the installed location of closure mechanism parts and electrically conductive parts.

FIG. 12 illustrates a perspective view of body 104 of clamp 100 according to embodiments, showing the location of closure mechanism parts and electrically conductive parts when installed. Body 102 (not shown) may be similarly configured. In the embodiment depicted in FIG. 12, part of a further closure is shown, which restricts access to the receiving region via an opening on the opposite side of the receiving region to closure 110. This further closure includes further shutter 172. FIG. 12 also illustrates the location of electrical connection part 148 within body 104. In the embodiments depicted in FIG. 12 electrically conducting part 154 is provided in the form of a conducting trough insert, with sides that extend along the walls of body 104 to provide electrical connection surface 152 along the exposed edge of the walls.

According to embodiments, the bodies 102, 104 are formed of an electrically insulating material. According to embodiments, the shutters 112, 114, 172 are formed of an electrically insulating material. In some such embodiments, the electrically insulating material comprises a plastic. In contrast, the electrical connection parts 146, 148 are formed of an electrically conductive material, such as a metal. Similarly, electrical connection terminal 154 and electrical linkage 156 are formed of an electrically conductive material, such as a metal. In some embodiments, bodies 102 and 104 are arms.

The above embodiments are to be understood as illustrative examples of the invention. Further embodiments of the invention are envisaged. It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims.

What is claimed is:

1. A clamp for establishing an electrical connection with a conductor, the clamp comprising:
    a first body;
    a second body, pivotally coupled to the first body, the first and second bodies defining a receiving region therebetween for receiving a conductor, the first and second bodies being biased towards each other at the receiving region to clamp a conductor; and
    a first shutter, movably coupled to the first body and a second shutter, movably coupled to the second body, the first shutter and the second shutter being biased into respective restricting positions in which entry into the receiving region is restricted.

2. The clamp of claim 1, wherein at least one of the first body and the second body comprises an electrical connection surface.

3. The clamp of claim 2, wherein the electrical connection surface and one or more of the first and second bodies comprise a notch for receiving a conductor, wherein the notch defines a notch region having a volume smaller than a volume of the receiving region.

4. The clamp of claim 3, wherein the notch is configured to prevent admission of an object having a diameter greater then 5 mm when the first body and the second body are proximate to each other.

5. The clamp of claim 1, wherein the first body comprises a first edge portion, and the second body comprises a second edge portion, the first and second edge portions defining an opening into the receiving region, wherein the first shutter and the second shutter are biased into respective positions which restrict entry into the receiving region via the opening.

6. The clamp of claim 5, wherein the opening has a diameter in the range of 15 mm to 65 mm when the first and second bodies are proximate to each other at the receiving region.

7. The clamp of claim 1, comprising shutter biasing means for biasing the first shutter into the respective restricting position.

8. The clamp of claim 1, wherein the first shutter is pivotally coupled to the first body.

9. The clamp of claim 1, comprising a shutter guide configured to define a range of motion of the first shutter.

10. The clamp of claim 1, comprising body biasing means biasing the first body towards the second body at the receiving region.

11. The clamp of claim 10, wherein the body biasing means comprises a spring.

12. The clamp of claim 1, comprising opening means operable to separate the first body and the second body at the receiving region.

13. The clamp of claim 12, wherein the opening means comprises:
   a first handle, coupled to, or comprised by, the first body, and
   a second handle, coupled to, or comprised by, the second body.

14. The clamp of claim 5,
   wherein the first shutter and the second shutter are biased to substantially cover the opening when the first and second bodies are proximate to each other at the receiving region.

15. The clamp of claim 14, wherein the first shutter and the second shutter are separable.

16. The clamp of claim 1, comprising a further shutter movably coupled to the first body and arranged on an opposing side of the receiving region to the first shutter and the second shutter, the further shutter being biased into a position which restricts entry into the receiving region via the opposing side of the receiving region to the first shutter and the second shutter.

17. The clamp of claim 16, wherein the first body comprises a first further edge portion, the second body comprises a second further edge portion, the first and second further edge portions defining a further opening into the receiving region on the opposing side of the receiving region to the first shutter and the second shutter, the further shutter being biased into a position which restricts access into the receiving region via the further opening.

18. The clamp of claim 1, wherein one or more of the first body, the second body, the first shutter and the second shutter comprise an electrically insulating material.

19. The clamp of claim 1, wherein the first shutter and the second shutter are replaceable.

\* \* \* \* \*